US 6,613,667 B1

(12) United States Patent
Kuo

(10) Patent No.: US 6,613,667 B1
(45) Date of Patent: Sep. 2, 2003

(54) FORMING AN INTERCONNECT OF A SEMICONDUCTOR DEVICE

(75) Inventor: Yue Kuo, College Station, TX (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 10/139,129

(22) Filed: May 2, 2002

Related U.S. Application Data

(60) Provisional application No. 60/288,053, filed on May 2, 2001, and provisional application No. 60/288,606, filed on May 3, 2001.

(51) Int. Cl.[7] .......................................... H01L 21/4763
(52) U.S. Cl. ..................................... 438/637; 438/675
(58) Field of Search .............................. 438/637, 641, 438/658, 662, 672, 675, 657, 674

(56) References Cited

U.S. PATENT DOCUMENTS 6,260,266 B1 * 7/2001 Tamaki

OTHER PUBLICATIONS

Yue Kuo and Sangheon Lee, "Plasma Process of a New Copper Dry Etching Method," Electrochem. Soc. Extended Abst. 2000–1, #296, 1 page, 2000.
*Meeting Abstracts*, The 197th Meeting of The Electrochemical Society, vol. 2000–I, Spring 2000, Toronto, Ontario, Canada, ISSN 1091–8213, ISBN 1-56677-282-6, Abstract No. 296, 2 pages, May 14–18, 2000.
*Chlorine Plasma/Copper Reaction in a New Cooper Dry Etching Process*, Sangheon Lee and Yue Kuo, *Journal of the Electrochemical Society*, 148 (9) (2001), Manuscript received Feb. 14, 2001; Available electronically Aug. 10, 2001, pp. G524–G529.

*Process Study Of A New Copper Dry Etching Method—The HCL Chemistry*; Sangheon Lee and Yue Kuo, *Plasma Processing XIII*, The Electrochemical Society Proceedings, vol. 2000–6, pp. 361–367, Undated.
*Room–temperature copper etching based on a plasma–copper reaction*, Yue Kuo and Sangheon Lee, *Applied Physics Letters*, vol. 78, No. 7, Feb. 12, 2001, pp. 1002–1004.
*Morphological Study of a New Copper Dry Etching Process*, Y. Kuo and S. Lee, AVS 47th International Symposium, Paper PS–WeP24, http://www.avssymposium.org/paper.asp?abstractID=1036, Jul. 17, 2000, 1 page.
*2000 Proceedings Seventeenth International VLSI Multilevel Interconnection Conference (VMIC)*, VMIC Catalog No. 00 IMIC—200, Library of Congress No. 89–644090, Jun. 27–29, 2000, pp. 38–44.
*A Novel Plasma–Based Copper Dry Etching Method*, Yue Kuo and Sangheon Lee, *Jpn. J. Appl. Phys.*, vol. 39 (2000) Pt. 2, No. 3A/B, *Express Letter*, pp. 188–190, Mar. 15, 2000.
*Copper dry etching with precise wafer–temperature control using $Cl_2$ gas as single reactant*, H. Miyazaki, K. Takeda, N. Sakuma, S. Kondo, Y. Homma, and K. Hinode, 1997 American Vacuum Society, J. Vac. Sci. Technol. B 15(2), Mar./Apr. 1997, pp. 237–240.

(List continued on next page.)

Primary Examiner—Phuc T. Dang
(74) Attorney, Agent, or Firm—Baker Botts L.L.P.

(57) ABSTRACT

Forming an interconnect of a semiconductor device includes defining a recessed structure proximate to an outer surface of a substrate of a semiconductor device. A metal layer is deposited within the recessed structure. A region of the metal layer is exposed to a plasma operable to react with the region of the metal layer. A metal compound layer is formed from the region of the metal layer by reacting the region of the metal layer with the plasma. The metal compound layer is removed from the semiconductor structure to yield a remaining metal layer. An interconnect of the semiconductor device is formed from the remaining metal layer.

17 Claims, 7 Drawing Sheets

OTHER PUBLICATIONS

*Copper Dry Etching with $Cl_2/Ar$ Plasma Chemistry*, J. W. Lee, Y.D. Park, J.R. Childress, S.J. Pearton, F. Sharifi, F. Ren, *J. Electrochem. Soc.*, vol. 145, No. 7, Jul. 1998, The Electrochemical Society, Inc., pp. 2585–2589.

*Lower temperature plasma etching of Cu using IR light irradiation*, Y. Ohshita, N. Hosoi, *Thin Solid Films 262*, Elsevier Science S.A., SSDI 0040–6090(94)05803–2, 1995, pp. 67–72.

*Reactive Ion Etching of Copper Films*, G.C. Schwartz and P.M. Schaible, *J. Electrochem Soc.: Accelerated Brief Communication*, vol. 130, No. 8, Aug. 1983, pp. 1777–1779.

*Reactive ion etching of copper in $SiCl_4$–based plasmas*, B. J. Howard and Ch. Steinbrüchel, *Appl. Phys. Lett.*, vol. 59, No. 8, 1991 American Institute of Physics, Aug. 19, 1991, pp. 914–916.

*Copper Dry Etching Technique for ULSI Interconnections*, Matthias Markert, Andreas Bertz and Thomas Gessner, 1997 Elsevier Science B.V., *Microelectronic Engineering 35* (1997), pp. 333–336.

* cited by examiner

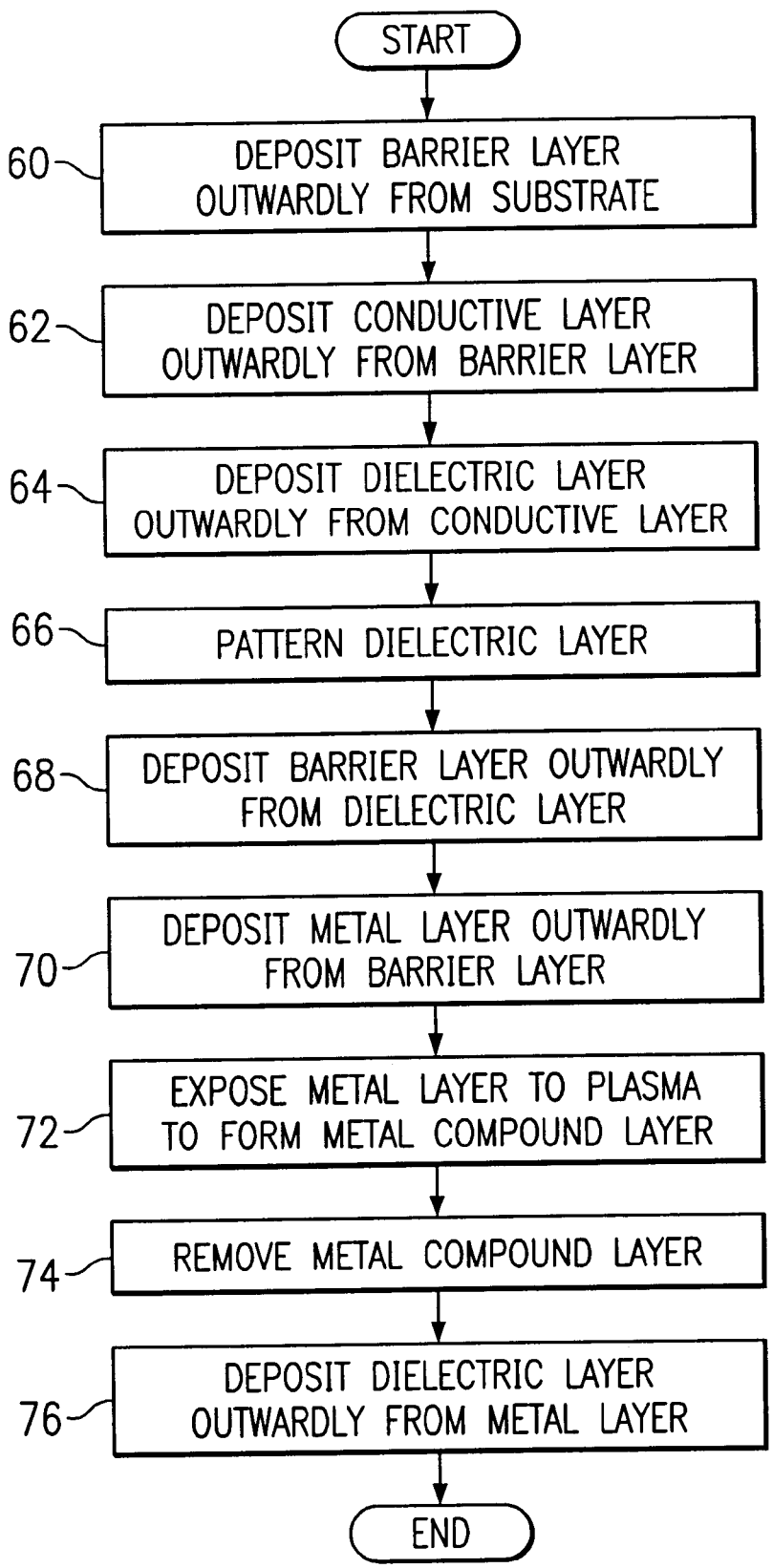

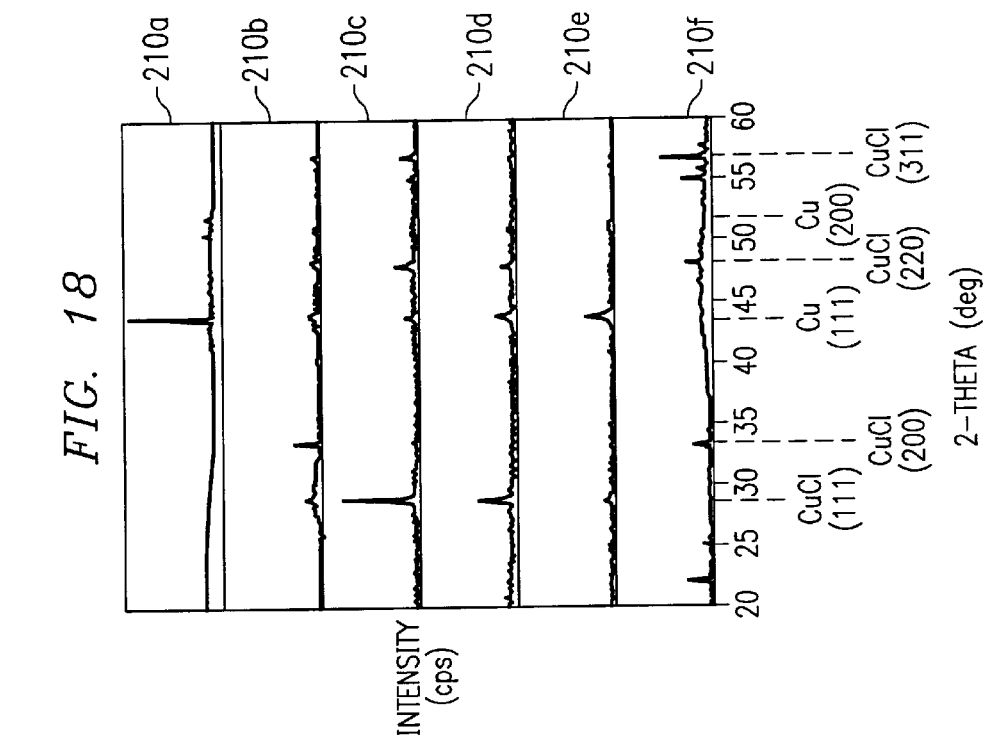
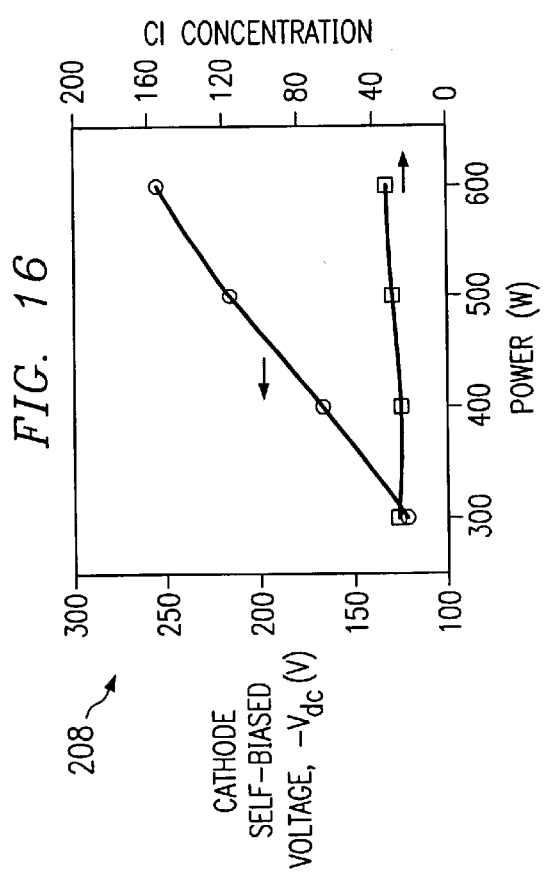
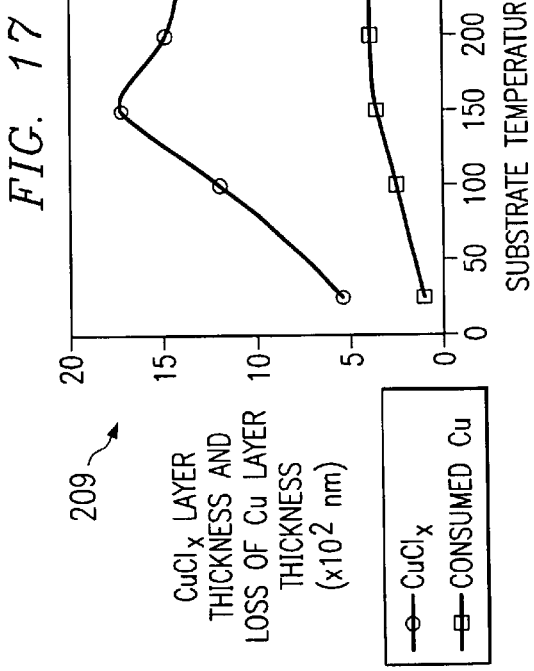

FORMING AN INTERCONNECT OF A SEMICONDUCTOR DEVICE

RELATED APPLICATION

This application claims benefit under 35 U.S.C. §119(e) of U.S. Provisional Application Ser. No. 60/288,053, filed May 2, 2001, entitled "PLASMA COPPER DAMASCENE METHOD AND APPARATUS, and of U.S. Provisional Application Ser. No. 60/288,606, filed May 3, 2001, entitled "PLASMA COPPER DAMASCENE METHOD AND APPARATUS."

TECHNICAL FIELD OF THE INVENTION

This invention relates generally to semiconductor fabrication and more specifically to forming an interconnect of a semiconductor device.

BACKGROUND OF THE INVENTION

Metals such as copper are typically used as interconnect material for ultra-large scale integrated circuits (ULSICs), microelectronics, opto-electronics, and other electronic devices. Known etching techniques for forming metal interconnects, however, have disadvantages. Some of the etching techniques result in poor etch uniformity or require the use of complex systems or processes. Consequently, forming metal interconnects for electronic devices has posed problems.

SUMMARY OF THE INVENTION

In accordance with the present invention, disadvantages and problems associated with previous techniques for forming an interconnect of a semiconductor device may be reduced or eliminated.

According to one embodiment of the present invention, forming an interconnect of a semiconductor device includes defining a recessed structure proximate to an outer surface of a substrate of a semiconductor device. A metal layer is deposited within the recessed structure. A region of the metal layer is exposed to a plasma operable to react with the region of the metal layer. A metal compound layer is formed from the region of the metal layer by reacting the region of the metal layer with the plasma. The metal compound layer is removed from the semiconductor structure to yield a remaining metal layer. An interconnect of the semiconductor device is formed from the remaining metal layer.

Certain embodiments of the invention may provide one or more technical advantages. A technical advantage of one embodiment may be that metal is removed by exposing the metal to a plasma to form a metal compound. The metal compound may be effectively removed by an acid or base solution or by heating. Another technical advantage of one embodiment may be that the metal removal is highly selective. Typically, the acid or base solution or heating removes only the metal that has been transformed into the metal compound. Another technical advantage of one embodiment may be that the removal of metal may be performed using a conventional plasma reactor, and thus does not require building new equipment.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 6 is a flowchart illustrating one embodiment of a method for forming an interconnect of a semiconductor device;

FIG. 16 is a graph illustrating a cathode self-biased voltage and a $Cl_2$ concentration with respect to plasma power;

FIG. 17 is a graph illustrating a $CuCl_x$ layer thickness and a loss of Cu layer thickness with respect to substrate temperature; and FIG. 18 depicts graphs that illustrate x-ray diffraction patterns of Cu layers before and after exposure to a $Cl_2$ plasma under various conditions.

DETAILED DESCRIPTION OF THE DRAWINGS

FIGS. 1 through 5 are a series of cross-sectional views illustrating stages of constructing a semiconductor device 10 in accordance with one embodiment of the present invention. According to the illustrated embodiment, a metal layer is deposited within trench structures. A portion of the metal layer is exposed to a plasma to form a metal compound layer. The metal compound layer is removed, and the remaining metal layer is used to form an interconnect of semiconductor device 10.

Figure 1:
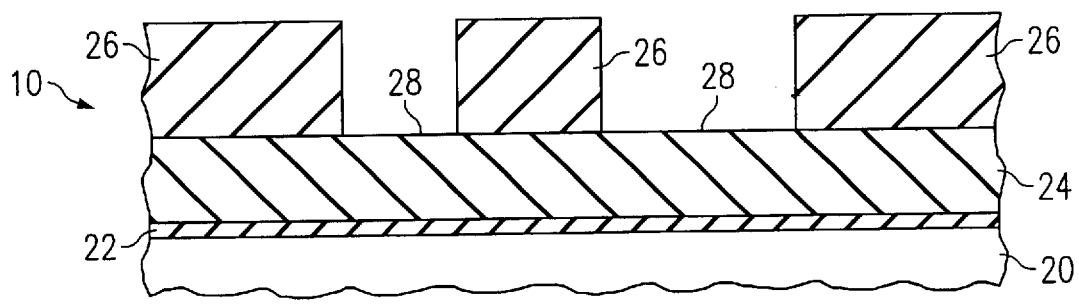
FIG. 1 is a cross-sectional view of a semiconductor device having layers disposed outwardly from a substrate.

FIG. 1 is a cross-sectional view of semiconductor device 10 having layers disposed outwardly from a substrate 20. Substrate 20 may comprise a substrate material such as silicon, glass, or plastic of a suitable thickness. A barrier layer 22 is disposed outwardly from substrate 20. Barrier layer 22 may comprise a suitable refractory material or its conductive compound such as tantalum, tantalum nitride, titanium, titanium nitride, or other material suitable for providing adhesion properties. Barrier layer 22 may be deposited to a suitable thickness such as approximately 20 to 30 nanometers using a thin film deposition technique such as sputtering, chemical vapor deposition, or electron beam evaporation.

A conductive layer 24 is disposed outwardly from barrier layer 22 and may comprise a suitable conductive material such as copper. Conductive layer 24 may be deposited to a thickness of approximately 250 to 500 nanometers using a suitable deposition technique such as electroplating, sputtering, electroless plating, or electron beam evaporation.

A dielectric layer 26 may be disposed outwardly from conductive layer 24. Dielectric layer 26 may comprise a dielectric material such as silicon dioxide, silicon nitride, spin-on glass, or low- or high-dielectric constant film deposited outwardly from conductive layer 24 using a suitable deposition process such as sputtering or chemical vapor deposition.

The thickness of dielectric layer 26 determines in part the thickness of an interconnect of semiconductor device 10. For example, dielectric layer 26 having a thickness of approximately 250 nanometers to 1 micrometer may be used to form an interconnect having a thickness of approximately 250 nanometers to 1 micrometer. Accordingly, the thickness of dielectric layer 26 may be adjusted in order to achieve a suitable thickness of the resulting interconnect. Dielectric layer 26 is patterned to form recessed structures such as trench structures 28. Recessed structures comprise features such as trench or via structures that may be filled with interconnect material to form interconnects. Dielectric layer 26 may be patterned using suitable patterning processes such as conventional photolithographic and plasma etching techniques. Patterning may, for example, use a mask with a commercial photoresist.

Figure 2:
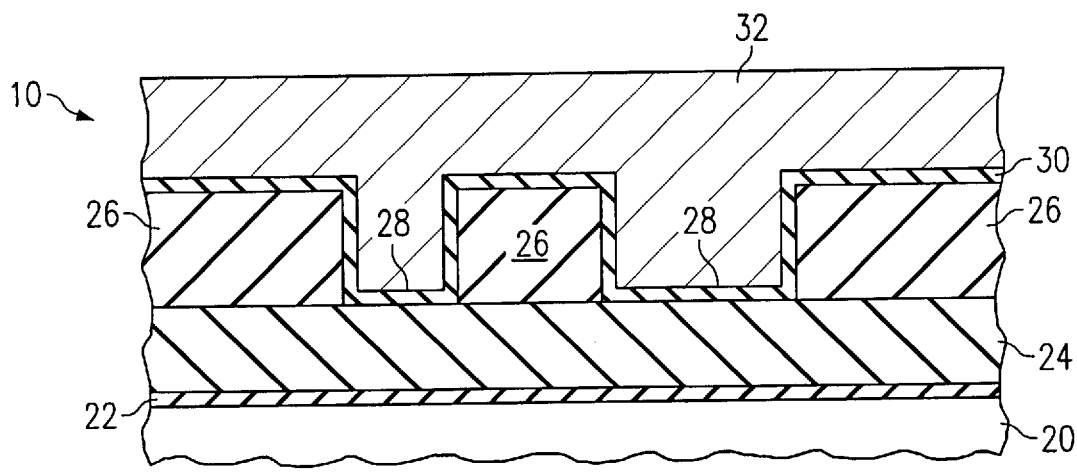
FIG. 2 is a cross-sectional view of a barrier layer and a metal layer of the semiconductor device of FIG. 1.

FIG. 2 is a cross-sectional view of a barrier layer 30 and a metal layer 32 of semiconductor device 10. Barrier layer 30 is disposed outwardly from dielectric layer 26. Barrier layer 30 may comprise a suitable refractory material or its conductive compound such as tantalum, tantalum nitride, titanium, titanium nitride, or other material suitable for providing adhesion properties. Barrier layer 30 may be deposited to a suitable thickness such as 20 to 30 nanometers using a conventional thin film deposition technique such as sputtering, chemical vapor deposition, or electron beam evaporation.

Metal layer 32 is disposed outwardly from barrier layer 30, and may comprise copper or other metal having a suitable thickness such as approximately 250 nanometers to 1 micrometer. Copper is typically used as an interconnect material for integrated circuits because copper has a high conductivity, negligible hillocks formation, and few electromigration problems. Copper interconnects are often used for sub-180 nanometers ultra-large scale integrated circuits. Metal layer 32 may be deposited using a suitable deposition technique such as electroplating, sputtering, electroless plating, chemical vapor deposition, or electron beam evaporation. According to one embodiment, a seed layer may be deposited outwardly from barrier layer 30, and metal layer 32 may be deposited on the seed layer.

Figure 3:
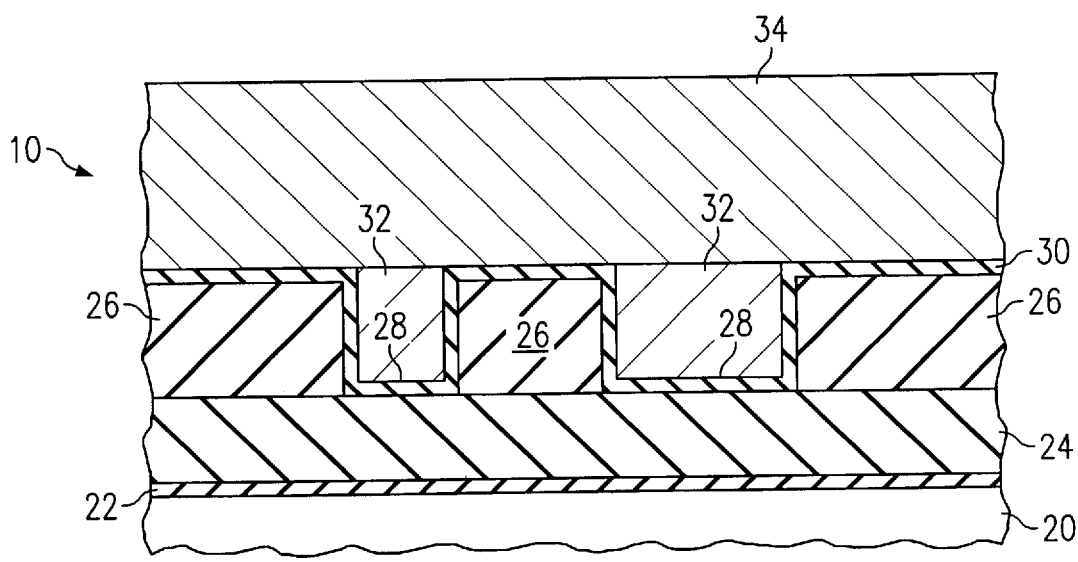
FIG. 3 is a cross-sectional view of a metal compound layer.

FIG. 3 is a cross-sectional view of a metal compound layer 34. Metal compound layer 34 is formed by exposing a portion or all of metal layer 32 to a plasma. The feed stream of the plasma may comprise, for example, hydrogen chloride (HCl), chlorine ($Cl_2$), hydrogen bromide (HBr), bromine ($Br_2$) or other component that reacts with metal layer 32 to form metal compound layer 34. The feed stream may comprise a combination of the above components, and may include non-reactive additives such as argon, helium, nitrogen, or freons.

Metal compound layer 34 may be granular with a rough surface, and have a thickness several times that of the exposed portion of metal layer 32. For example, if metal layer 32 comprising copper and having a substrate temperature of approximately 25° C. is exposed to $Cl_2$ plasma at a pressure of 20 mTorr at a plasma power of 600 watts for one minute, metal compound layer 34 may have a thickness of approximately 3.5 times that of the consumed copper. The composition of metal compound layer 34 depends on the composition of metal layer 32 and of the feed stream of the plasma. For example, if metal layer 32 comprises copper and the feed stream comprises chlorine, metal compound layer 34 comprises copper and chlorine. If metal layer 32 comprises copper and the feed stream comprises bromine, metal compound layer 34 comprises copper and bromine.

Figure 4:
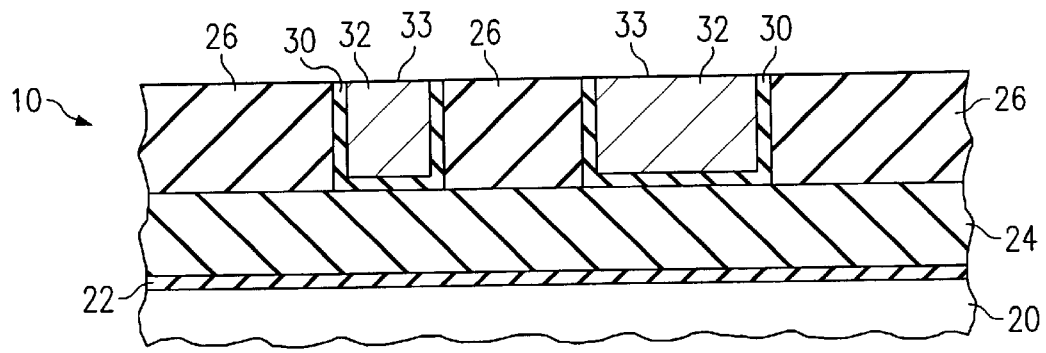
FIG. 4 is a cross-sectional view of the semiconductor device of FIG. 1 after removal of the metal compound layer and exposed portions of the barrier layer.

FIG. 4 is a cross-sectional view of semiconductor device 10 after removal of metal compound layer 34 and exposed portions of barrier layer 30. Metal compound layer 34 may be removed by a suitable process. For example, if metal compound layer 34 comprises chloride or bromide, metal compound layer 34 may be removed by a weak acid solution such as six percent hydrochloric acid (HCl) and de-ionized water, a weak base solution such as ammonia ($NH_3$) diluted with de-ionized water, or other suitable solution. Typically, barrier adhesion layer 30 and metal layer 32 are not removed by a weak acid or base solution.

The residue from using the weak acid solution may be removed by rinsing semiconductor device 10 with de-ionized water. Other solutions, however, may be used to remove metal compound layer 34, for example, a strong acid may be used to remove metal compound layer 34. Metal compound layer 34 may also be removed by heating substrate 20 at a high temperature, for example, approximately 450° C., to evaporate metal compound layer 34. The exposed portions of barrier layer 30 may be removed by suitable techniques such as plasma etching or wet etching.

Metal layer 32 has an outer surface 33 disposed outwardly from substrate 20. Outer surface 33 is substantially not curved, or non-curved, and has a roughness. The roughness may range from, for example, two to three nanometers in surface difference under more favorable plasma conditions and from nine to ten nanometers in surface difference under less favorable plasma conditions.

Figure 5:
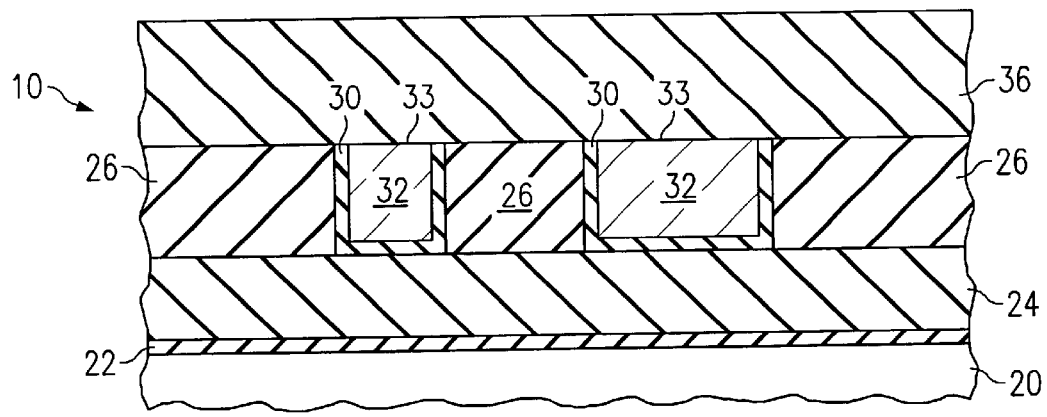
FIG. 5 is a cross-sectional view of a dielectric layer of the semiconductor device of FIG. 1.

FIG. 5 is a cross-sectional view of a dielectric layer 36 of semiconductor device 10. Dielectric layer 36 is disposed outwardly from metal layer 32. Dielectric layer 36 may comprise a dielectric material such as silicon dioxide, silicon nitride, or polyimide deposited to a suitable thickness using a deposition technique such as sputtering, chemical vapor deposition, or spin-on coating.

FIG. 6 is a flowchart illustrating one embodiment of a method for forming an interconnect of semiconductor device 10. The method begins at step 60, where barrier layer 22 is deposited outwardly from substrate 20. Conductive layer 24 is deposited outwardly from barrier layer 22 at step 62. Dielectric layer 26 is deposited outwardly from conductive layer 24 at step 64. Dielectric layer 26 is patterned at step 66 to form trench structures 28. Barrier layer 30 is deposited outwardly from dielectric layer 22 at step 68.

Metal layer 32 is deposited outwardly from barrier layer 30 at step 70. Metal layer 32 may comprise, for example, copper. Metal layer 32 is exposed to plasma to form metal compound layer 34 at step 72. The feed stream of the plasma may comprise, for example, hydrogen chloride (HCl), chlorine ($Cl_2$), Hydrogen bromide (HBr), bromine ($Br_2$), or other component suitable for reacting with metal layer 32 to form metal compound layer 34. The formation of metal compound layer 34 may be performed using a plasma reactor. The plasma reactor may have a conventional parallel plate or an asymmetric electrode configuration.

During the formation of metal compound layer 34, substrate 20 may be at a suitable temperature, for example, approximately 25° to 250° C., and loaded on a substrate electrode. A power supply may be coupled to either the substrate electrode or the opposite electrode to generate plasma in the reactor or remote from the electrode, for example, in the reactive ion etch (RIE) plasma etch (PE), or remote plasma etch (RPE) mode. The power supply for the plasma reactor may comprise, for example, a direct current source, a radio frequency source operating at frequencies such as 13.56 megahertz or 50 kilohertz, or a high-density source such as an electron cyclotron resonance, a helicon, or an inductive coupled source. The plasma power may operate within a suitable range, for example, 300 to 600 watts. Typically, the power requirement is dependent on the size and configuration of the plasma reactor. The reactor pressure may range from a low pressure to a high pressure, for example, approximately 1 mTorr to 100 Torr.

The consumption of metal layer 32 may be controlled by adjusting the reaction conditions. For example, a longer exposure time may increase the consumption of metal layer 32. A decrease in reactor pressure may increase the consumption rate of metal layer 32 by changing the plasma phase chemistry and the ion bombardment energy. An increase in plasma power or an increase in the frequency of a radio frequency source may increase the consumption rate, and an increase in the temperature of substrate 20 may also increase the consumption rate.

The composition of the plasma may also affect the reaction rate. For example, a plasma comprising HBr typically results in a faster reaction rate than a plasma comprising HCl or $Cl_2$. Additives to the feed stream may also affect the reaction time. For example, a plasma that includes argon may result in a higher reaction rate. A plasma that includes a low concentration of nitrogen may result in a higher reaction rate than a plasma that includes a high concentration of nitrogen. The reaction may be stopped when portions of metal layer 32 that are not located within trench structures 28 are converted to metal compound layer 34 and portions of metal layer 32 that are located within trench structures 28 remain as metal layer 32. Typically, a plasma that does not react with barrier layer 30 is used.

According to one embodiment, metal layer 32 comprising copper having a thickness of 250 nanometers and temperature of 25° C. is exposed to a $Cl_2$ plasma at a plasma power of 600 watts and a pressure of 20 mTorr for two minutes. The plasma gas rate may be 20 standard cubic centimeters per minute. A chamber of the plasma reactor may be at a background pressure of $10^{-5}$ Torr prior to the plasma reaction.

Metal compound layer 34 is removed at step 74. Metal compound layer 34 may be removed using a weak acid solution or other solution suitable for removing metal compound layer 34, and for not removing metal layer 32 or barrier layer 30. The remaining metal layer 32 has an outer surface 33 that is substantially non-curved and rough. According to one embodiment, the exposed portions of barrier layer 30 may also be removed. Dielectric layer 36 is deposited outwardly from metal layer 32 at step 76. After depositing dielectric layer 36, the method is terminated.

Other embodiments of the present invention may be obtained by varying certain processes or parameters. For example, the formation of metal compound layer 34 may be performed at room temperature or at a higher or lower temperature. Metal compound layer 34 may be removed using a weak or strong acid or other solutions at a wide range of temperatures. Metal layer 32 may be deposited according to a wide range of techniques, for example, sputtering, electroplating, electroless plating, chemical vapor deposition, electron beam evaporation, on a variety of substrates. Dielectric layer 36 may comprise silicon oxide, silicon nitride, spin-on glass, low- or high-dielectric constant films, or other suitable dielectric.

FIGS. 7 through 11 are a series of cross-sectional views illustrating stages of constructing a semiconductor device 110 in accordance with one embodiment of the present invention. According to the illustrated embodiment, a metal layer is deposited within trench and via structures. A portion or all of the metal layer is exposed to a plasma to form a metal compound layer. The metal compound layer is removed, and the remaining metal layer is used to form an interconnect of semiconductor device 110.

Figure 7:
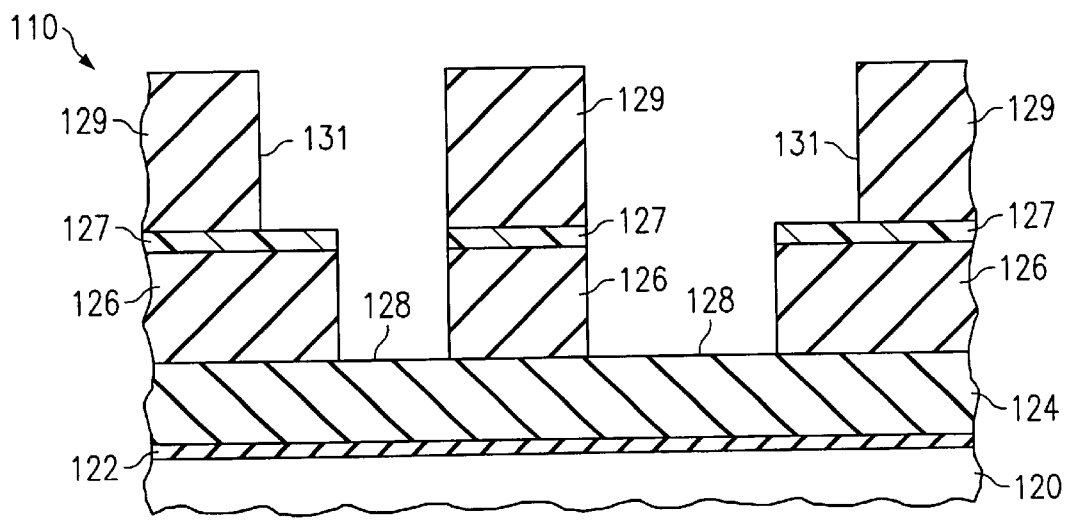
FIG. 7 is a cross-sectional view of a semiconductor device having layers disposed outwardly from a substrate.

FIG. 7 is a cross-sectional view of semiconductor device 110 having layers disposed outwardly from a substrate 120. Substrate 120 may be substantially similar to substrate 20. A barrier layer 122 is disposed outwardly from substrate 120. Barrier layer 122 may be substantially similar to barrier layer 22. A conductive layer 124 is disposed outwardly from barrier layer 122. Conductive layer 124 may be substantially similar to conductive layer 24.

A dielectric layer 126 is disposed outwardly from conductive layer 124. Dielectric layer 126 may comprise a dielectric material such as silicon dioxide, silicon nitride, spin-on glass, or low- or high-dielectric constant film deposited outwardly from conductive layer 124 using a suitable deposition process such as sputtering, chemical vapor deposition, or spin-on coating.

An etch stop layer 127 is disposed outwardly from dielectric layer 126. Etch stop layer 127 is used to pattern dielectric layer 126 to form via structures 128. Dielectric layer 126 may be patterned using suitable patterning processes such as conventional photolithography and plasma etching techniques. A dielectric layer 129 is disposed outwardly from etch stop layer 127. Dielectric layer 129 may be substantially similar to dielectric layer 126. Dielectric layer 129 is patterned to form trench structures 131.

The thickness of dielectric layers 126 and 129 determines in part the thickness of an interconnect of semiconductor device 110. Accordingly, the thickness of dielectric layers 126 and 129 may be adjusted in order to achieve a suitable thickness for the interconnect.

Figure 8:
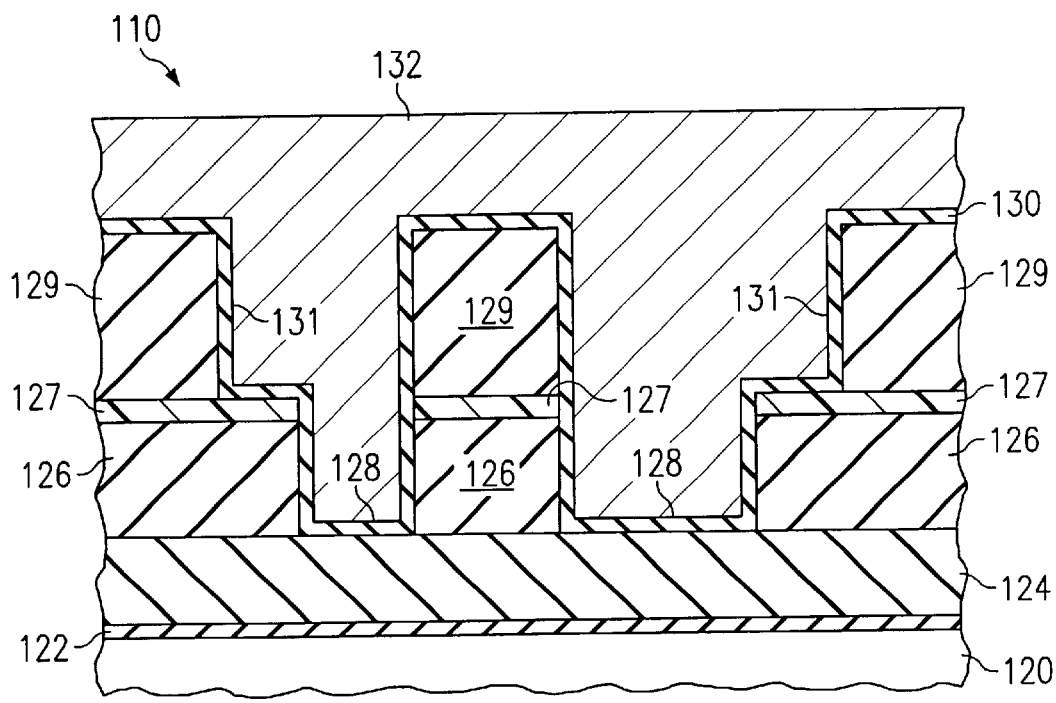
FIG. 8 is a cross-sectional view of a barrier layer and a metal layer of the semiconductor device of FIG. 7.

FIG. 8 is a cross-sectional view of a barrier layer 130 and a metal layer 132 of semiconductor device 110. Barrier layer 130 is disposed outwardly from dielectric layer 126. Barrier layer 130 may be substantially similar to barrier layer 30. Metal layer 132 is disposed outwardly from barrier layer 130, and may comprise copper or other metal. Metal layer 132 may be substantially similar to metal layer 32.

Figure 9:
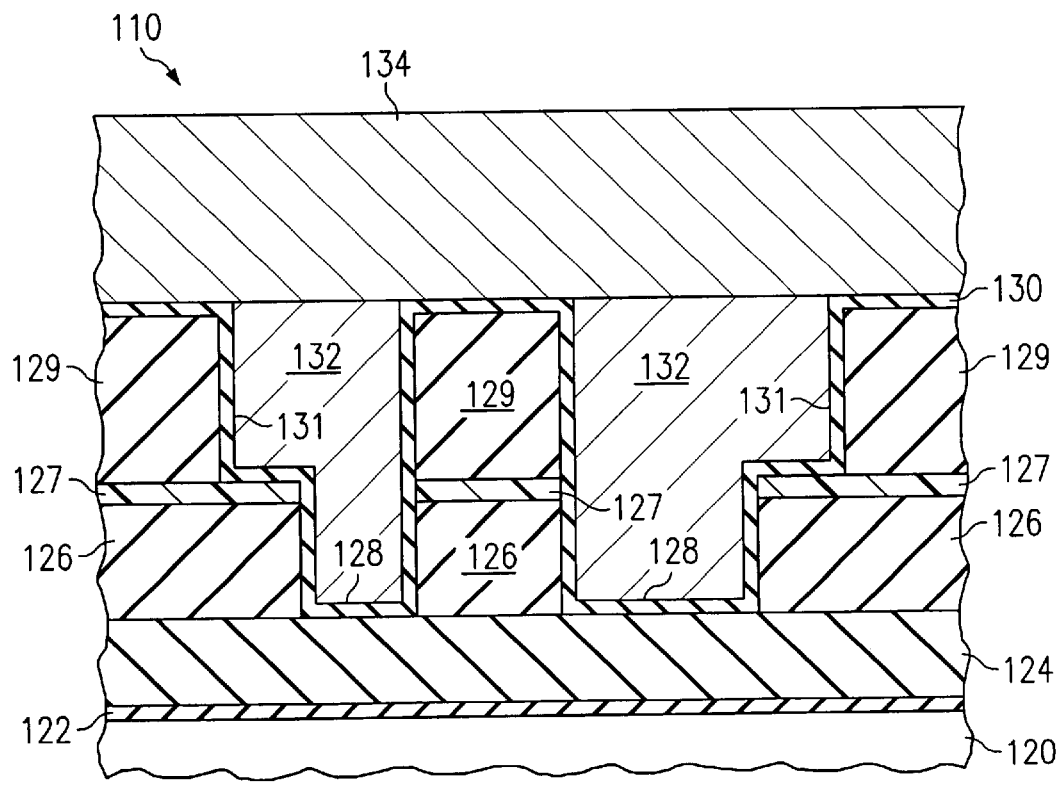
FIG. 9 is a cross-sectional view of a metal compound layer.

FIG. 9 is a cross-sectional view of a metal compound layer 134 of semiconductor device 110. Metal compound layer 134 is formed by exposing a portion or all of metal layer 132 to a plasma. The feed stream of the plasma may comprise, for example, hydrogen chloride (HCl), chlorine ($Cl_2$), hydrogen bromide (HBr), bromine ($Br_2$) or other component that reacts with metal layer 132 to form metal compound layer 134. The feed stream may comprise a combination of the above components, and may include non-reactive additives such as argon, helium, nitrogen, or freon. Metal compound layer 134 may be substantially similar to metal compound layer 34.

Figure 10:
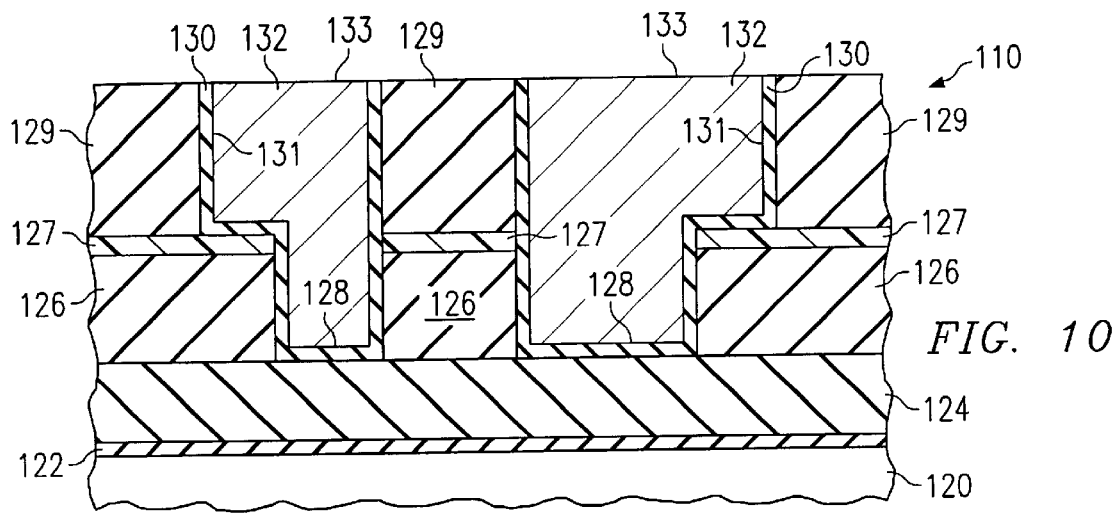
FIG. 10 is a cross-sectional view of the semiconductor device of FIG. 7 after removal of the metal compound layer and exposed portions of the barrier layer.

FIG. 10 is a cross-sectional view of semiconductor device 110 after removal of metal compound layer 134 and exposed portions of barrier layer 130. Metal compound layer 134 may be removed by a suitable process. The exposed portions of barrier layer 130 may be removed by suitable techniques such as plasma etching or wet solution. The remaining metal layer 32 has an outer surface 133 that is substantially non-curved and rough.

Figure 11:
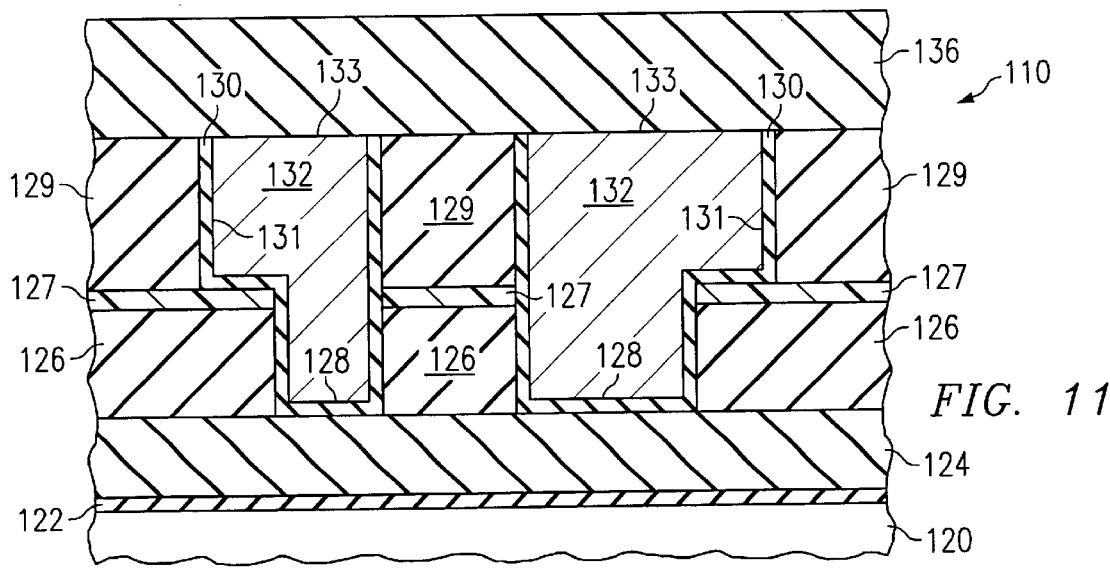
FIG. 11 is a cross-sectional view of a dielectric layer of the semiconductor device of FIG. 7.

FIG. 11 is a cross-sectional view of a dielectric layer 136 of semiconductor device 110. Dielectric layer 136 is disposed outwardly from metal layer 132. Dielectric layer 136 may be substantially similar to dielectric layer 36.

FIGS. 12 through 17 are graphs illustrating changes in metal layer 32 and metal compound layer 34 with respect to changes in various process parameters. In the illustrated examples, metal layer 32 comprises a Cu layer exposed to a plasma comprising $Cl_2$, which yields metal compound layer 34 comprising a $CuCl_x$ layer.

Figure 12:
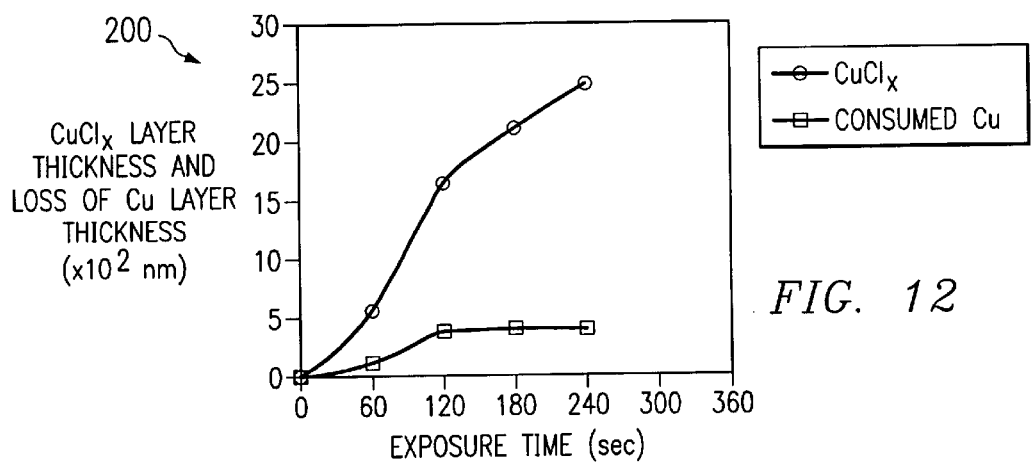
FIG. 12 is a graph illustrating a $CuCl_x$ layer thickness and a loss of Cu layer thickness with respect to exposure time.

FIG. 12 is a graph 200 illustrating a $CuCl_x$ layer thickness and a loss of Cu layer thickness with respect to exposure time. A Cu layer having a substrate temperature of 25° C. is exposed to a $Cl_2$ plasma at a pressure of 20 mTorr, a plasma power of 600 W, and a gas flow rate of 20 standard cubic centimeters per minute.

Graph 200 indicates that the thickness of the $CuCl_x$ layer increases monotonically with time. If the exposure time is less than two minutes, the thickness increases drastically, and if the exposure time is greater than two minutes, the thickness increases slowly. The thickness of the Cu layer behaves in a similar manner. If the exposure time is less than two minutes, the Cu consumption is nearly proportional to the exposure time. If the exposure time is greater than two minutes, the curve is flat, indicating consumption of most or all of the Cu layer. Accordingly, the increase of the thickness of the $CuCl_x$ layer after two minutes of exposure time may be attributed to the increase of the extent of chlorination of the $CuCl_x$ layer. In the illustrated example, the sample is flat and non-recessed. For a recessed structure such as a trench or via, the exposure time and other parameters may be properly adjusted such that the Cu within the recessed area is reacted to a minimum extent.

According to one embodiment, the $CuCl_x$ layer grows perpendicularly to the surface of the $CuCl_x$ layer, and a small portion of the $CuCl_x$ layer disposed outwardly from barrier layer 30 grows in a radial direction. The grain size and the porosity of the $CuCl_x$ layer increases with time.

The reaction may be described as proceeding from an outer surface of the Cu layer toward substrate 20. During the reaction, Cl radicals generated in the plasma phase are transported through the $CuCl_x$ layer to the Cu layer. The composition and structure of the $CuCl_x$ layer change in response to contact with the Cl radicals.

Figure 13:
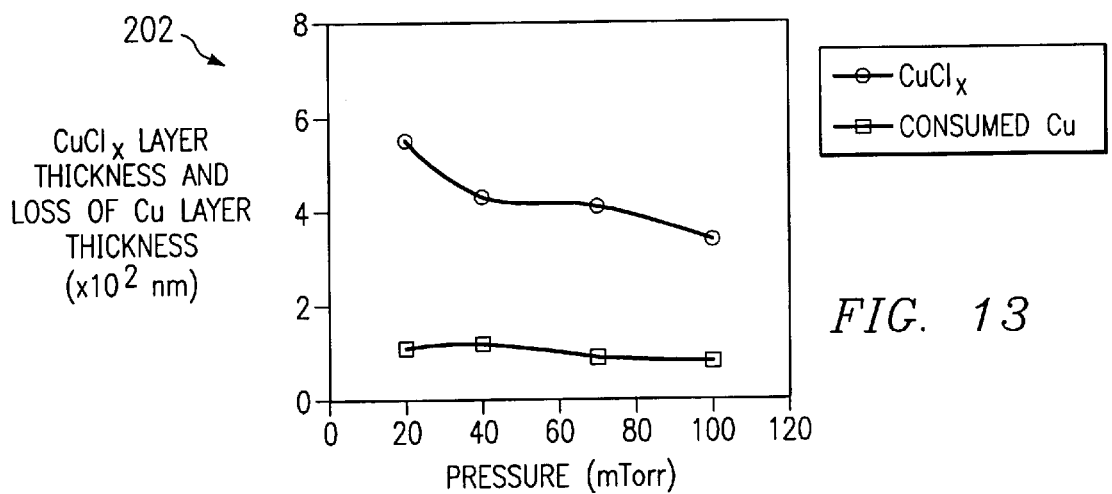
FIG. 13 is a graph illustrating a $CuCl_x$ layer thickness and a loss of Cu layer thickness with respect to pressure.

FIG. 13 is a graph 202 illustrating a $CuCl_x$ layer thickness and a loss of Cu layer thickness with respect to pressure. A Cu layer having a temperature of 25° C. is exposed to a plasma at a plasma power of 600 watts and a gas flow rate of 20 standard cubic centimeters per minute for one minute. Graph 202 illustrates that the $CuCl_x$ layer thickness and the loss of Cu layer thickness decrease with increasing pressure, where the decrease of the $CuCl_x$ layer thickness is more pronounced than the decrease of the loss of Cu layer thickness. In the $Cl_2$ plasma process, the ion bombardment energy and the chlorine radical concentration are dependent on the pressure, both of which directly contribute to the Cu-plasma $Cl_2$ reaction.

According to one embodiment, exposure at a pressure of 100 mTorr yields a $CuCl_x$ layer disposed outwardly from a Cu layer. The $CuCl_x$ layer and the Cu layer comprise copper chloride compounds with different extents of chlorination. The $CuCl_x$ layer is more granular that the Cu layer. A $CuCl_x$ layer grown at 100 mTorr has horizontally shaped grains substantially parallel to the interface between the $CuCl_x$ layer and the Cu layer, while a $CuCl_x$ layer grown at 20 mTorr has vertically shaped grains substantially parallel to an outward direction from substrate 20. Accordingly, it may be concluded that pressure affects the layer structure.

Figure 14:
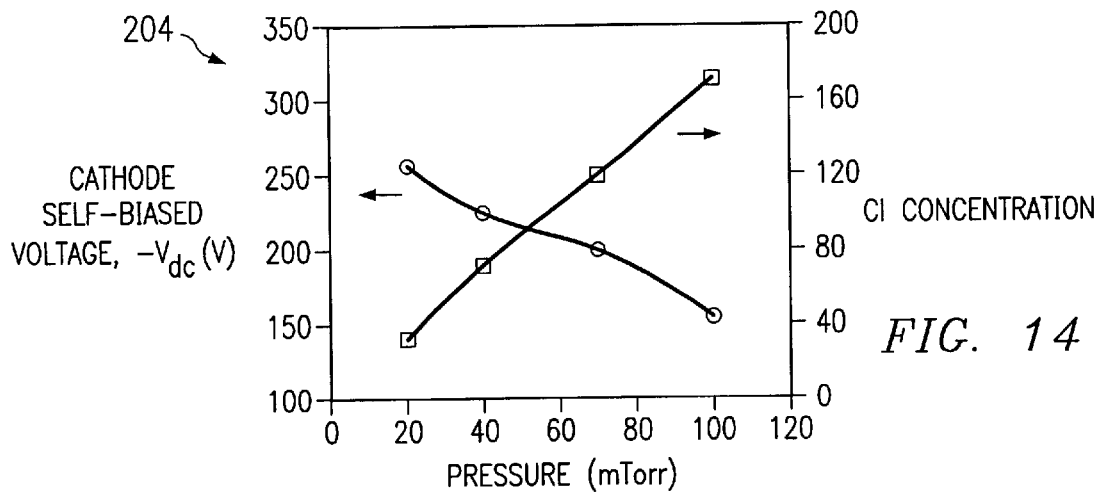
FIG. 14 is a graph illustrating a cathode self-biased voltage and a $Cl_2$ concentration with respect to pressure.

FIG. 14 is a graph 204 illustrating a cathode self-biased voltage and a $Cl_2$ concentration with respect to pressure. In the illustrated example, the $Cl_2$ concentration is estimated by an actinometry process that yields the intensity ratio of Cl at 837 nanometers ($I_{Cl}$) and Ar at 811 nanometers ($I_{Ar}$) multiplied by the total pressure (P).

Graph 204 indicates that the Cu consumption rate is consistent with the change of ion bombardment energy more than the $Cl_2$ concentration. Grains of the $CuCl_x$ layer grown at a low pressure, or high $-V_{dc}$, are aligned in the same direction as that of ion acceleration. Accordingly, it may be concluded that ion bombardment directly affects the reaction process and grain orientation.

Figure 15:
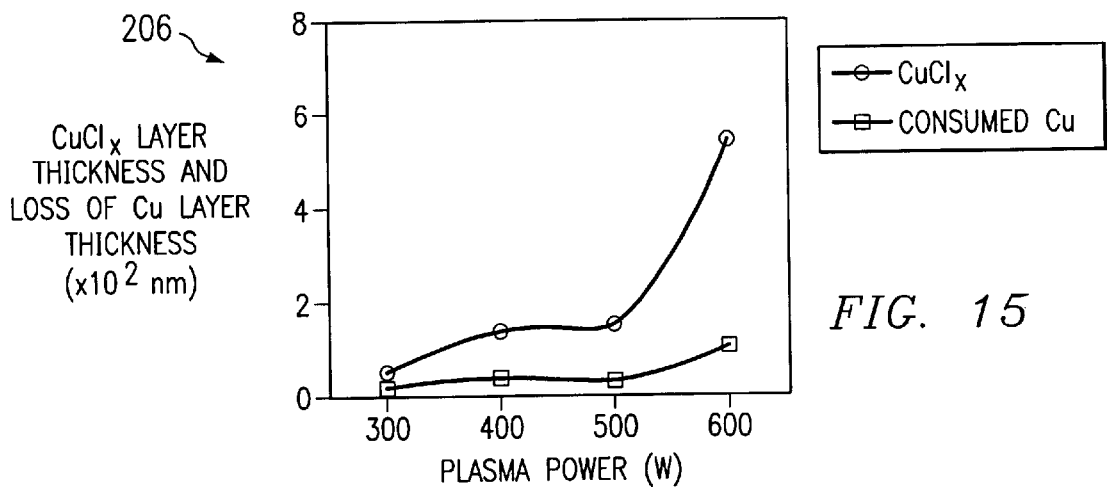
FIG. 15 is a graph illustrating a $CuCl_x$ layer thickness and a loss of Cu layer thickness with respect to plasma power.

FIG. 15 is a graph 206 illustrating a $CuCl_x$ layer thickness and a loss of Cu layer thickness with respect to plasma power. In the illustrated example, a Cu layer at 25° C. is exposed to plasma at a pressure of 20 mTorr at a gas flow rate of 20 standard cubic centimeters per minute for one minute. Graph 206 indicates that a $CuCl_x$ layer grown at a higher power is thicker than a $CuCl_x$ layer grown at a lower power. The increase is drastic at a threshold power range greater than 500 watts. The grain structure of the $CuCl_x$ layer grown at a higher power is rougher and more porous than the grain structure of the $CuCl_x$ layer grown at a lower power.

FIG. 16 is a graph 208 illustrating a cathode self-biased voltage and a $Cl_2$ concentration with respect to plasma power. Graph 208 indicates that the ion bombardment energy increases linearly with an increase of plasma power, but the $Cl_2$ concentration does not change significantly. Accordingly, it may be concluded that the $CuCl_x$ behavior at the threshold power range cannot be explained by the ion bombardment energy or the $Cl_2$ concentration. According to one embodiment, the grain structure of the $CuCl_x$ layer may be used to describe the effects. For example, if the $CuCl_x$ layer is porous, the accelerated ions may readily penetrate the $CuCl_x$ layer to facilitate a reaction at the outer surface of the Cu layer. The ion bombardment may also influence the direction of the $CuCl_x$ growth, which may change the morphology of the $CuCl_x$ layer near the threshold power range.

FIG. 17 is a graph 209 illustrating a $CuCl_x$ layer thickness and a loss of Cu layer thickness with respect to substrate temperature. In the illustrated example, a Cu layer is exposed to a $Cl_2$ plasma at a pressure of 20 mTorr, a plasma power of 600 watts, and a gas flow rate of 20 standard cubic centimeters per minute for one minute. Graph 209 indicates that the loss of Cu layer thickness increases monotonically with the increase of the substrate temperature up to 200° C. Above 200° C., the thickness does not change because substantially all of the Cu layer is consumed after one minute.

The $CuCl_x$ layer thickness change can be described in two parts. From room temperature to 150° C., the thickness increases with the increase of temperature due to the enhancement of the Cl transport rate and the reaction rate. The Cu consumption rate may be very high, for example, greater than 400 nanometers per minute at 200° C. or above. The $CuCl_x$ curve, however, has a higher slope than that of the Cu curve because the $CuCl_x$ layer formed at a higher temperature may be more porous and may have a higher Cl content than the $CuCl_x$ layer formed at a lower temperature.

Above 150° C., the $CuCl_x$ layer thickness decreases with an increase of temperature. Since the vapor pressure of $CuCl_x$ typically increases with the increase of substrate temperature, the $CuCl_x$ evaporation may become non-negligible above 150° C. Accordingly, above 150° C. the $CuCl_x$ layer thickness may decrease with the increase of substrate temperature.

According to one embodiment there may be a large distribution of grain size, with the grain size decreasing from the outer surface of the $CuCl_x$ layer towards substrate 20.

FIG. 18 depicts graphs 212a through 212f that illustrate x-ray diffraction patterns of Cu layers before and after exposure to a $Cl_2$ plasma under various conditions. Graph 210a describes a Cu layer before exposure to plasma. Graph 210b describes a Cu layer at a substrate temperature of 25° C. exposed to a $Cl_2$ plasma at a pressure of 20 mTorr, a plasma power of 600 watts, and a gas flow rate of 20 standard cubic centimeters per minute for one minute. Graph 210c describes a Cu layer at a substrate temperature of 25° C. exposed to a $Cl_2$ plasma at a pressure of 20 mTorr, a plasma power of 600 watts, and a gas flow rate of 20 standard cubic centimeters per minute for two minutes.

Graph 210d describes a Cu layer at a substrate temperature of 25° C. exposed to a plasma at a pressure of 100 mTorr, a plasma power of 600 watts, and a gas flow rate of 20 standard cubic centimeters per minute for two minutes. Graph 210e describes a Cu layer at a substrate temperature of 25° C. exposed to a plasma at a pressure of 20 mTorr, a plasma power of 300 watts, and a gas flow rate of 20 standard cubic centimeters per minute for two minutes. Graph 210f describes a Cu layer at a substrate temperature of 250° C. exposed to a plasma at a pressure of 20 mTorr, a plasma power of 600 watts, and a gas flow rate of 20 standard cubic centimeters per minute for two minutes.

Graphs 210a through 210f illustrate several relationships. For example, the amount of unreacted Cu decreases with an increase of plasma exposure time, a decrease of pressure, or an increase of plasma power. The amount of $CuCl_x$ increases with an increase of the plasma exposure time, a decrease of pressure, or an increase of plasma power. A Cu layer formed at a high plasma power, low pressure, and long exposure time includes CuCl (220) and CuCl (311) similar to that of the Cu layer exposed at 250° C., indicating that harsh plasma conditions favor the copper chlorination reaction.

According to one embodiment, chlorine radicals generated during a plasma phase are transported through a $CuCl_x$ layer to an outer surface of an unreacted Cu layer. New $CuCl_x$ is formed at the interface of the $CuCl_x$ layer and the Cu layer. Some unreacted Cu atoms may remain in the $CuCl_x$ layer due to the granular structure of the original Cu layer. If the Cu layer has a polycrystalline structure, chlorine radicals diffuse through the grain boundary at a higher speed than through the bulk of the grain. In addition, the $Cu-Cl_2$ reaction rate at the grain boundary may be faster than that within the grain. Accordingly, the Cu chlorination reaction proceeds from the outer surface towards substrate 20 primarily along the grain boundaries and secondarily within the bulk of the grain.

Certain embodiments of the invention may provide one or more technical advantages. A technical advantage of one embodiment may be that metal is removed by exposing the metal to a plasma to form a metal compound. The metal compound may be effectively removed by an acid solution. Another technical advantage of one embodiment may be that the metal removal is highly selective. Typically, the acid solution removes only the metal that has been transformed into the metal compound. Another technical advantage of one embodiment may be that the removal of metal may be performed using a conventional plasma reactor, and thus does not require building new equipment.

Although an embodiment of the invention and its advantages are described in detail, a person skilled in the art could make various alterations, additions, and omissions without departing from the spirit and scope of the present invention as defined by the appended claims.

What is claimed is:

1. A method for forming an interconnect of a semiconductor device, comprising:
   defining a recessed structure proximate to an outer surface of a substrate of a semiconductor device;
   depositing a metal layer within the recessed structure;
   exposing a region of the metal layer to a plasma operable to react with the region of the metal layer;
   forming a metal compound layer from the region of the metal layer by reacting the region of the metal layer with the plasma, the plasma comprising a component selected from a group consisting of hydrogen chloride (HCl), chlorine ($Cl_2$), hydrogen bromide (HBr), and bromine ($Br_2$);
   removing the metal compound layer from the semiconductor structure to yield a remaining metal layer; and
   forming an interconnect of the semiconductor device from the remaining metal layer.

2. The method of claim 1, wherein:
   the metal layer comprises copper; and
   the metal compound layer comprises a copper compound.

3. The method of claim 1, wherein removing the metal compound layer comprises exposing the metal compound layer to a member selected from a group consisting of an acid solution, a base solution, and heat.

4. The method of claim 1, wherein the recessed structure comprises a trench structure.

5. The method of claim 1, wherein the recessed structure comprises a via structure.

6. The method of claim 1, further comprising depositing a dielectric layer outwordly from the remaining metal layer.

7. The method of claim 1, wherein exposing the region of the metal layer to a plasma comprises using a plasma reactor to expose the metal region of the metal layer to the plasma.

8. The method of claim 1, further comprising adjusting a reaction time associated with forming the metal compound layer by changing a pressure associated with the plasma.

9. The method of claim 1, further comprising adjusting a reaction time associated with forming the metal compound layer by changing a temperature associated with the substrate.

10. The method of claim 1, further comprising adjusting a reaction time associated with forming the metal compound layer by changing a frequency of a power supply associated with the plasma.

11. A method for forming an interconnect of a semiconductor device, comprising:
   defining a recessed structure proximate to an outer surface of a substrate of a semiconductor device;

depositing a copper layer within the recessed structure;

exposing a region of the copper layer to a plasma operable to react with the region of the copper layer, the plasma comprising a component selected from a group consisting of hydrogen chloride (HCl), chlorine ($Cl_2$), hydrogen bromide (HBr), and bromine ($Br_2$);

forming a copper compound layer from the region of the copper layer by reacting the region of the copper layer with the plasma;

removing the copper compound layer from the semiconductor structure by exposing the copper compound layer to a member selected from a group consisting of an acid solution, a base solution, and heat to yield a remaining copper layer;

depositing a dielectric layer outwardly from the remaining copper layer; and forming an interconnect of the semiconductor device from the remaining copper layer.

12. The method of claim 11, wherein the recessed structure comprises a trench structure.

13. The method of claim 11, wherein the recessed structure comprises a via structure.

14. The method of claim 11, wherein exposing the region of the copper layer to a plasma comprises using a plasma reactor to expose the copper region of the copper layer to the plasma.

15. The method of claim 11, further comprising adjusting a reaction time associated with forming the copper compound layer by changing a pressure associated with the plasma.

16. The method of claim 11, further comprising adjusting a reaction time associated with forming the copper compound layer by changing a temperature associated with the substrate.

17. The method of claim 11, further comprising adjusting a reaction time associated with forming the copper compound layer by changing a frequency of a power supply associated with the plasma.

* * * * *